United States Patent
Ito et al.

(10) Patent No.: US 9,018,075 B2
(45) Date of Patent: Apr. 28, 2015

(54) PLASMA PROCESSING METHOD

(75) Inventors: Toru Ito, Kudamatsu (JP); Hiroaki Ishimura, Kudamatsu (JP); Akito Kouchi, Kudamatsu (JP); Hayato Watanabe, Hofu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 523 days.

(21) Appl. No.: 13/404,162

(22) Filed: Feb. 24, 2012

(65) Prior Publication Data

US 2013/0164911 A1 Jun. 27, 2013

(30) Foreign Application Priority Data

Dec. 21, 2011 (JP) ................................. 2011-279150

(51) Int. Cl.
*H01L 21/762* (2006.01)
(52) U.S. Cl.
CPC ................ *H01L 21/76229* (2013.01)
(58) Field of Classification Search
None
See application file for complete search history.

(56) References Cited

U.S. PATENT DOCUMENTS

| | | | |
|---|---|---|---|
| 2002/0185469 A1* | 12/2002 | Podlesnik et al. | ............. 216/41 |
| 2009/0065479 A1 | 3/2009 | Nakaune et al. | |
| 2009/0275202 A1* | 11/2009 | Tanaka et al. | ............... 438/700 |

FOREIGN PATENT DOCUMENTS

| | | |
|---|---|---|
| JP | 2003-7679 | 1/2003 |
| KR | 10-2009-0003716 | 1/2009 |
| KR | 10-0927691 | 3/2009 |
| WO | WO 2011/115761 | 9/2011 |

* cited by examiner

*Primary Examiner* — Seahvosh Nikmanesh
(74) *Attorney, Agent, or Firm* — Baker Botts L.L.P.

(57) ABSTRACT

The present invention provides a plasma processing method in which sideetching and microloading can be suppressed in a plasma processing method of forming trenches with a mask having a minimum opening width of 20 nm or less. The plasma processing method of the present invention is characterized by including the steps of forming trenches by plasma etching, forming a nitride film on sidewalls of trenches using plasma, and forming an oxide film on sidewalls and bottom surfaces of the trenches using plasma.

18 Claims, 8 Drawing Sheets

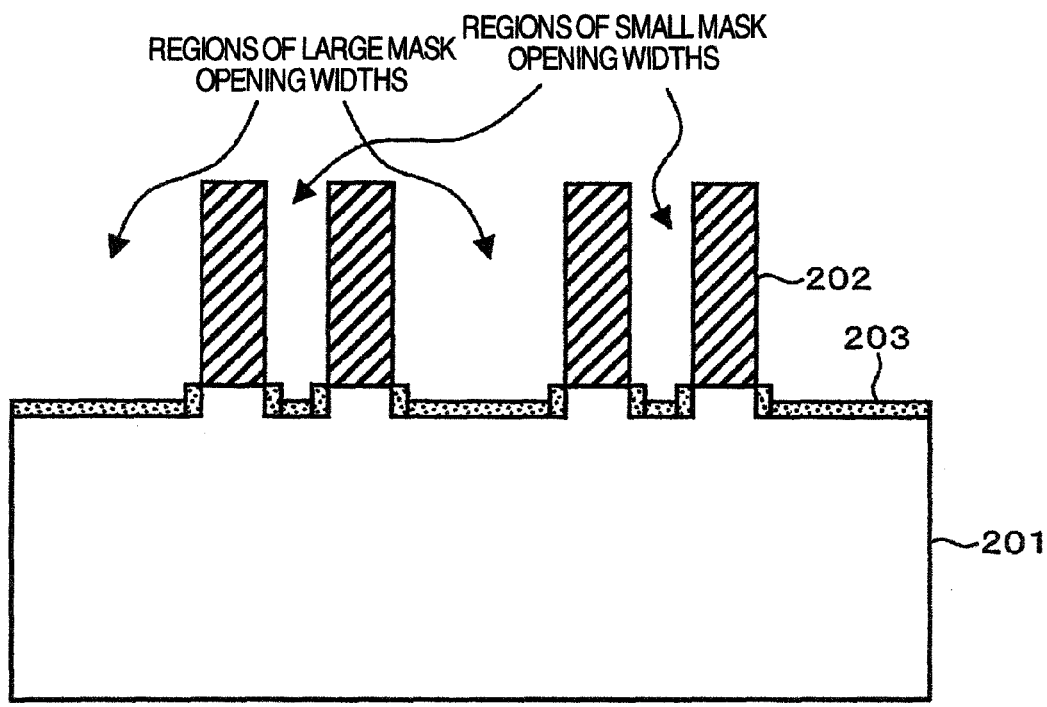
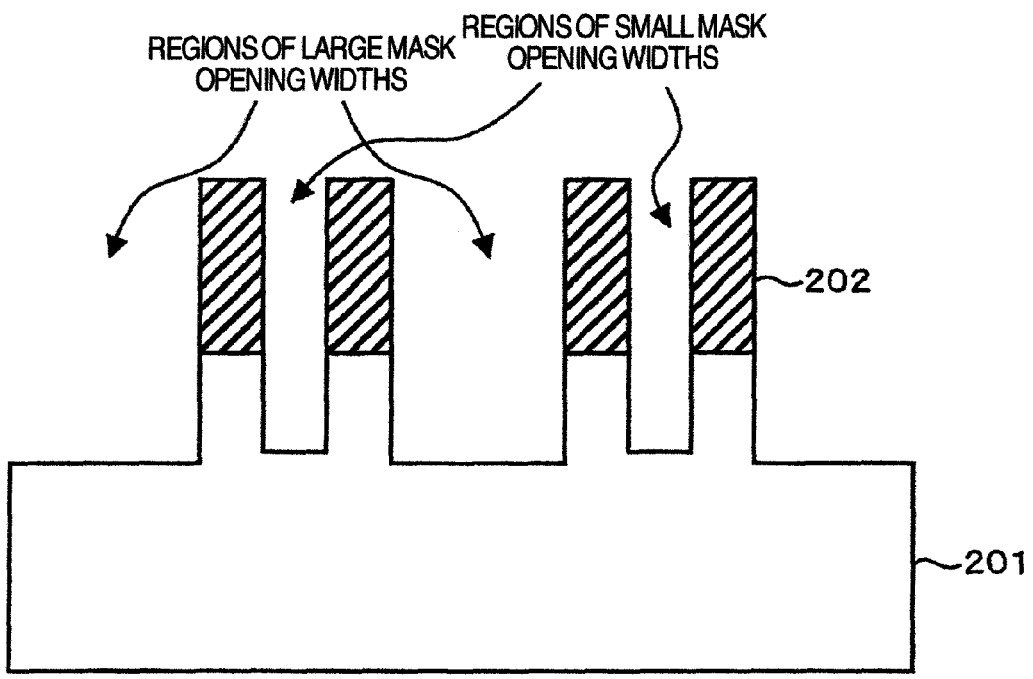

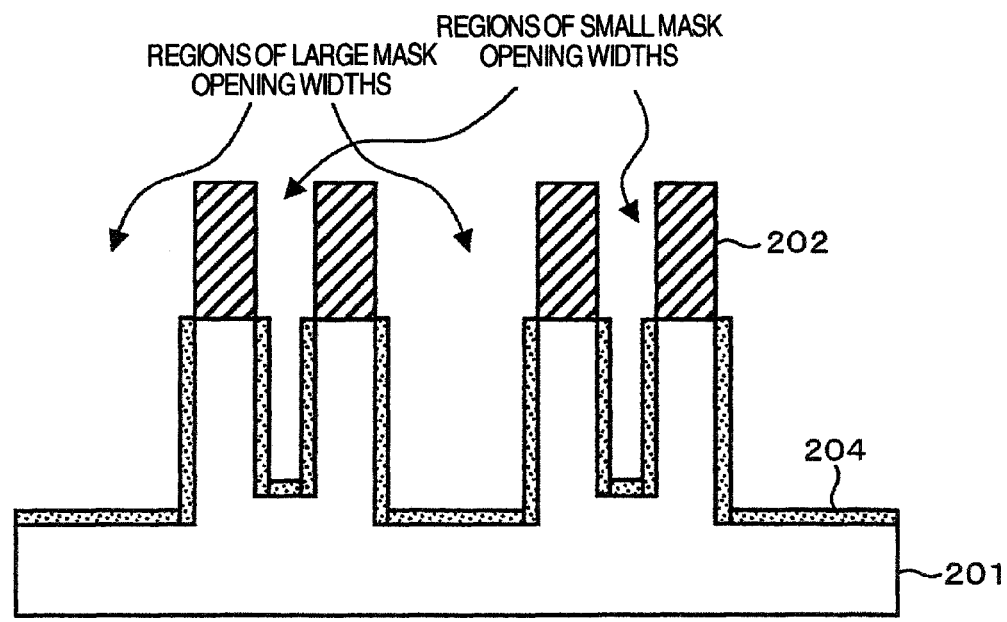
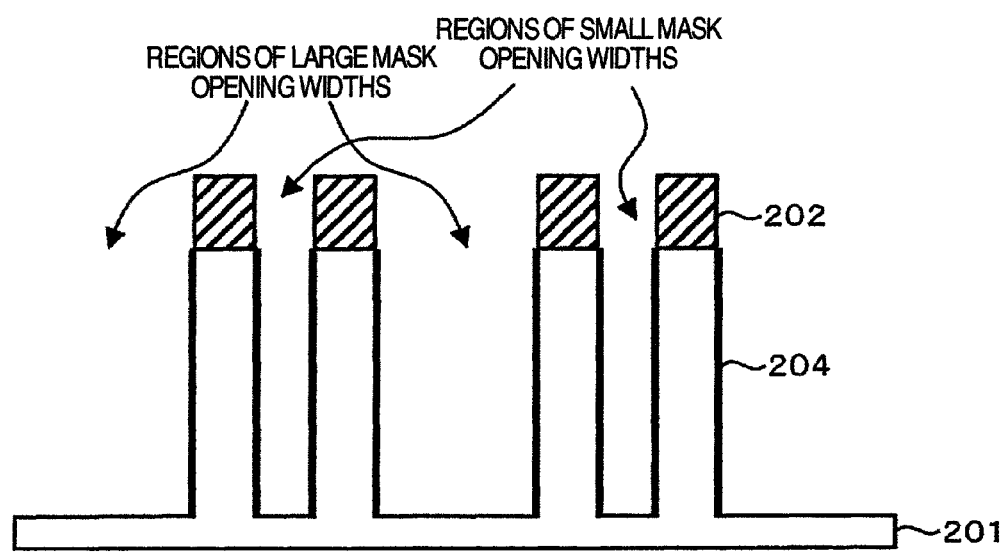

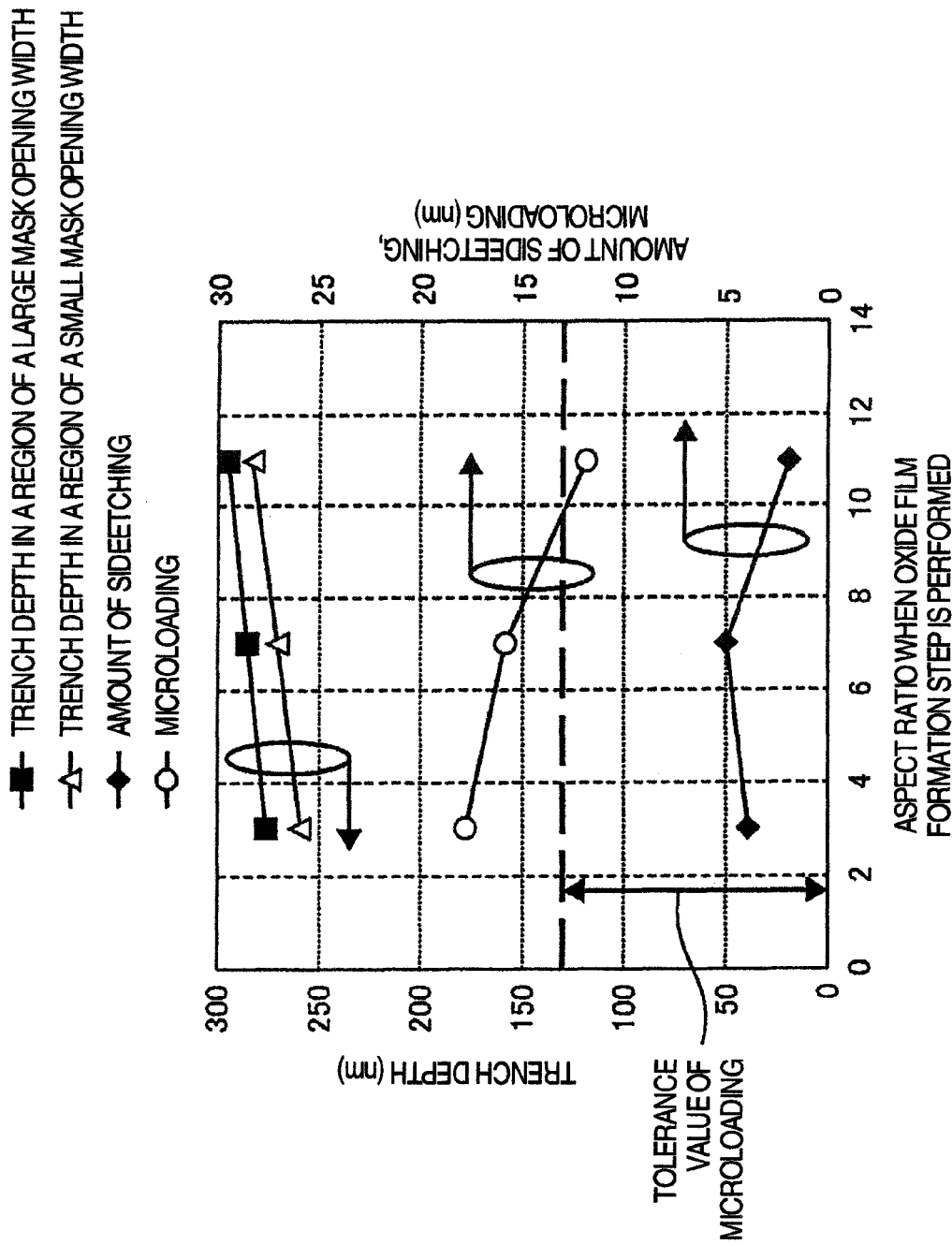

PLASMA PROCESSING METHOD

BACKGROUND OF THE INVENTION

The present invention relates to a method for manufacturing semiconductor devices and, more particularly, to a plasma processing method in which plasma etching is conducted.

In recent years, along with higher integration of semiconductor devices, shallow-trench isolation (hereinafter abbreviated STI) techniques have been used as a device isolation method.

In an STI technique, a silicon substrate is first plasma-etched, for example, using a silicon nitride film as a mask to form trenches for device isolation. The formed trenches are then filled with a silicon oxide film and unwanted portions of the silicon oxide film are removed by chemical mechanical polishing (CMP) so that STI regions are formed.

JP-A-2003-007679 discloses a method for performing etching by plasma etching using gases including at least $Cl_2$ and HBr as a method for forming trenches for device isolation.

Furthermore, along with higher integration of semiconductor devices of recent years, higher miniaturization has been required; in STI techniques for the next-generation semiconductor devices, trenches having a depth of about 300 nm are required to be formed using a mask having an opening width of 20 nm or less.

SUMMARY OF THE INVENTION

However, when an attempt is made to form trenches having such a high aspect ratio by plasma etching using gases including at least $Cl_2$ and HBr as disclosed in JPA-2003-007679, sideetching on the sidewalls of the trenches takes place in regions where the opening widths of the mask are small as shown in FIG. 3; furthermore, microloading occurs. Here, the microloading is etching in which trenches in regions of wider mask opening widths become deeper than trenches in regions of narrower mask opening widths.

In view of the aforementioned problem, the present invention is intended to provide a plasma processing method in which sideetching and microloading can be suppressed in a plasma processing method for forming trenches with a mask having a minimum opening width of 20 nm or less.

The present invention is characterized in a plasma processing method for forming trenches with a mask having a minimum opening width of 20 nm or less by including the steps of forming trenches by plasma etching, forming a nitride film on sidewalls of trenches using plasma, and forming an oxide film on sidewalls and bottom surfaces of trenches using plasma.

With the present invention sideetching and microloading can be suppressed in a plasma processing method for forming trenches with a mask having a minimum opening width of 20 nm or less.

Other objects, features, and advantages of the invention will become apparent from the following description of the embodiments of the invention taken in conjunction with the accompanying drawings.

BRIEF DESCRIPTION OF THE DRAWINGS

FIG. 2C is a diagram showing an etch profile after a first nitride film formation step;

FIG. 2D is a diagram showing an etch profile after a first trench formation step;

FIG. 2G is a diagram showing an etch profile after an oxide film formation step;

FIG. 2H is a diagram showing an etch profile after a third trench formation step;

FIG. 5 is a graph showing the dependence on the aspect ratio at the oxide film formation step.

DESCRIPTION OF THE EMBODIMENTS

Figure 1:
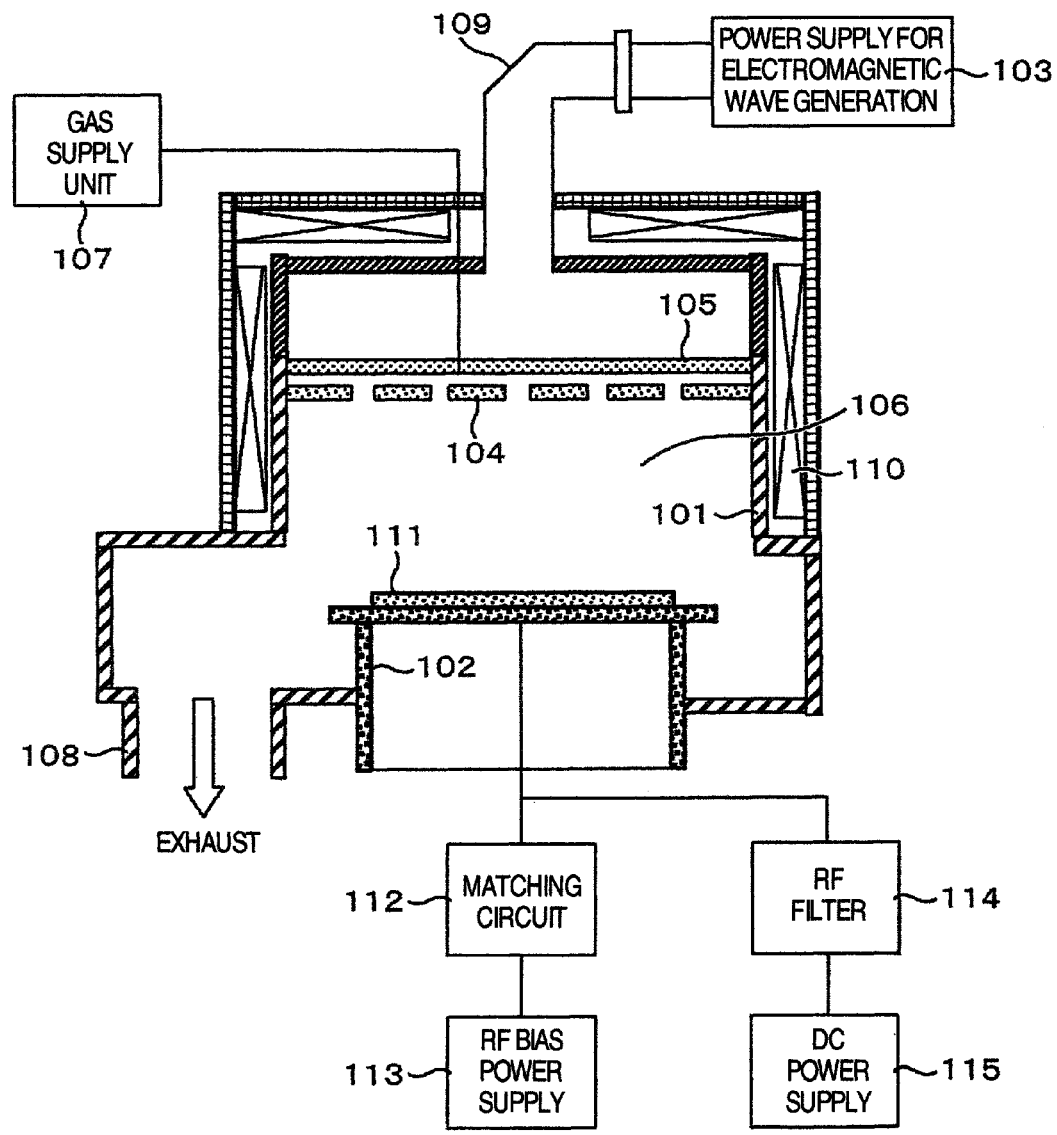
FIG. 1 is a diagram of a plasma etching apparatus associated with the present invention.

Embodiments of the present invention are hereinafter described with reference to the drawings. First, a plasma etching apparatus for implementing the present invention is described by referring to FIG. 1.

A processing chamber 106 is formed by installing a shower plate 104 (made of quartz, for example), which is for introduction of a process gas into a vacuum vessel 101, and a dielectric window 105 (made of quartz, for example) on an open upper portion of the vacuum vessel 101 and hermetically sealing off. In the shower plate 104 a plurality of apertures to supply the process gas into the processing chamber 106 are arranged and the process gas supplied from a gas supply unit 107 is introduced into the processing chamber 106 via the plurality of apertures in the shower plate 104. A vacuum pumping unit (not shown) is connected with the vacuum vessel 101 via a vacuum exhaust port 108.

In order to supply radio-frequency (RF) power for generating plasma into the processing chamber 106, a waveguide 109 for transmitting an electromagnetic wave is provided over the dielectric window 105. The electromagnetic wave (RF wave for the generation of the plasma) which is transmitted to the waveguide 109 is generated from a power supply for electromagnetic wave generation 103. The frequency of the electromagnetic wave is not particularly limited; in the present embodiment a microwave of 2.45 GHz is used. At the outer periphery of the processing chamber 106 a coil for magnetic field generation 110 is provided to form a magnetic field and the microwave generated from the power supply for electromagnetic wave generation 103 generates high-density plasma inside the processing chamber 106 due to an interaction with the magnetic field formed by the coil for magnetic field generation.

Also, a sample stage 102 for mounting a wafer is provided at the bottom portion of the vacuum vessel 101 facing against the shower plate 104. The surface of the sample stage 102 is covered with a thermal spraying film (not shown) and the sample stage 102 is connected with a DC power supply 115 via an RF filter 114. Further, an RF bias power supply 113 is connected to the sample stage 102 via a matching circuit 112. A temperature regulator (not shown) is also connected to the sample stage 102.

A wafer 111 that is a sample transferred into the processing chamber 106 adheres onto the sample stage 102 by an electrostatic force produced by the DC voltage applied from the DC power supply 115 and is regulated in temperature; after a desired process gas is supplied by the gas supply unit 107 the inside of the vacuum vessel 101 is set to a given pressure with the vacuum pumping unit (not shown) to generate plasma inside the processing chamber 106.

Next, by supplying RF power to the sample stage 102 from the RF bias power supply 113 ions from the plasma are drawn into the wafer, thus plasma-etching the wafer 111. Also, since the RF bias power supply 113 is equipped with a pulse generator, it is possible to supply time-modulated intermittent or continuous RF power to the sample stage 102.

Further, the wafer 111 is transferred into the vacuum vessel 101 with a transfer unit (not shown) and mounted onto the sample stage 102. The process gas is supplied into the vacuum vessel 101 by the gas supply unit 107 and a microwave is supplied into the processing chamber 106 from the power supply for electromagnetic wave generation 103 while controlling the pressure inside the processing chamber 106 through the vacuum pumping unit, thus generating plasma. By the plasma generated inside the processing chamber 106 the wafer 111 mounted on the sample stage 102 is etched while supplying RF power from the RF bias power supply 113 onto the sample stage 102.

A plasma processing method for forming trenches for device isolation with a mask pattern of 20 nm or less using the aforementioned plasma etching apparatus is described below.

Figure 2A:
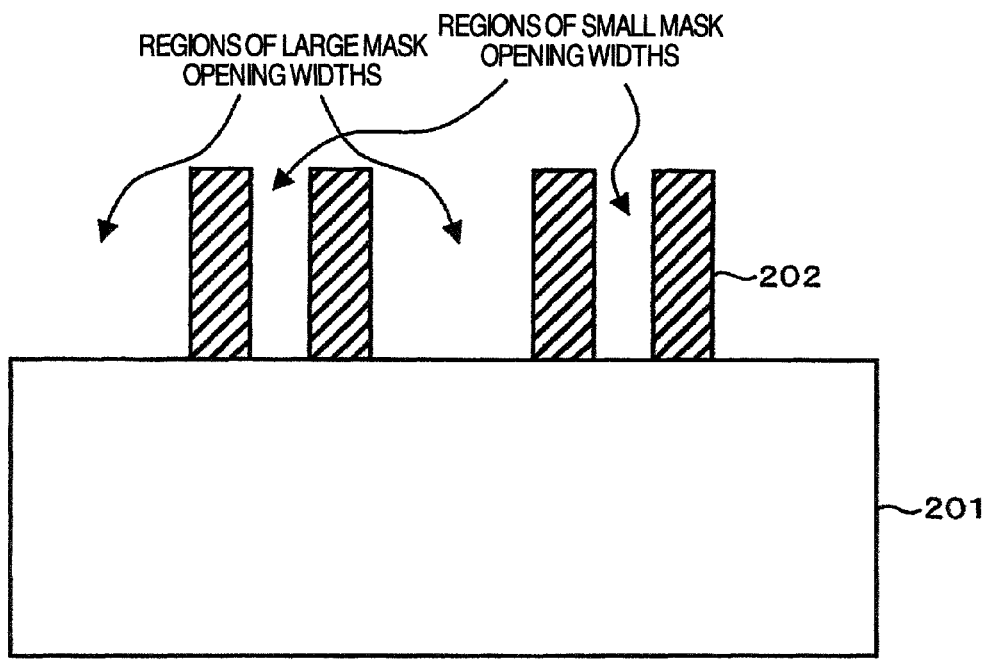
FIG. 2A is a diagram showing a structure of a wafer 111 on which trenches for device isolation are formed.

First, the structure of the wafer 111 in which the trenches for device isolation are formed is described by referring to FIG. 2A. A silicon nitride film 202 as a mask is present on a silicon substrate 201; the mask of the silicon nitride film 202 is made open ahead of time. The opening width of the mask of the silicon nitride film 202 is not the same; the mask of the silicon nitride film 202 is roughly comprised of regions of small opening widths and regions of large opening widths. In the present embodiment, the smallest opening width of the mask of the silicon nitride film 202 is 20 nm. Furthermore, in the present embodiment, trenches having a depth of about 300 nm are to be formed.

A breakthrough step is first performed in which a native oxide film deposited on the surface of the silicon substrate 201 and made of silicon oxide is removed and the silicon substrate 201 is further etched so that trenches having a depth of about 60 nm are formed on the silicon substrate 201.

As shown in Table 1, in the breakthrough step with 60 ml/min of $O_2$ gas, 60 ml/min of $CHF_3$ gas, a process pressure of 2.0 Pa, microwave power of 700 W, time-modulated RF bias power of 800 W, and a duty ratio of 10% for the time-modulated RF bias power the native oxide film is removed and trenches about 60 nm deep are formed.

Figure 2B:
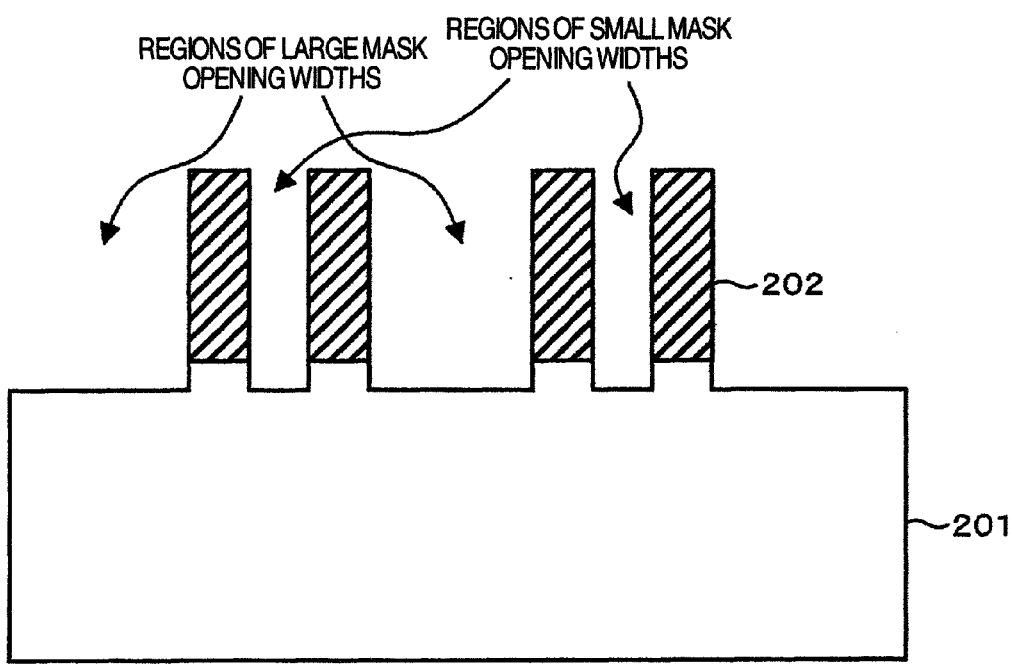
FIG. 2B is a diagram showing an etch profile after a breakthrough step.

At completion of the breakthrough step, the trenches about 60 nm deep are formed such that no sideetching occurs on the sidewalls of the trenches and almost no microloading occurs as shown in FIG. 2B. Incidentally, as for the duty ratio, it becomes $T_{on}/(T_{on}+T_{off})$, where $T_{on}$ is the ON time and $T_{off}$ is the OFF time of the time-modulated intermittent RF power. Since the breakthrough step is plasma etching performed while the time-modulated RF bias power is supplied, the selectivity of the etch rate for the trenches over the mask can be improved compared with the case where a continuous RF bias power is used.

Next, a first nitride film formation step is performed to form a nitride film primarily on the sidewalls of the trenches formed in the breakthrough step.

As shown in Table 1, in the first nitride film formation step with 100 ml/min of $N_2$ gas, a process pressure of 2.0 Pa, microwave power of 600 W, and RF bias power of 0 W, the nitride film 203 is formed.

At completion of the first nitride film formation step, a nitride film 203 is formed on the sidewalls and the bottom surfaces of the trenches formed by the breakthrough step as shown in FIG. 2C. The longer the first nitride film formation step is performed, the thicker nitride film 203 can be formed; as described above, in this first nitride film formation step, the nitride film 203 is also formed on the bottom surfaces of the trenches and, therefore, etching in a subsequent first trench formation step would be hindered if a thick nitride film 203 is formed.

Hence, the first nitride film formation step is carried out only during the time in which the nitride film 203 is formed to a film thickness at which etching during the subsequent first trench formation step will not be hindered.

Furthermore, although only $N_2$ gas is used in the first nitride film formation step of the present embodiment, a mixture gas of $N_2$ gas and Ar gas or a mixture gas of $N_2$ gas and He gas may be used.

Next, a first trench formation step is performed to form trenches having a depth of about 140 nm by etching the trenches, on which the nitride film 203 is formed by the first nitride film formation step, by a depth equivalent to about 80 nm.

As shown in Table 1, in the first trench formation step with 100 ml/min of $Cl_2$ gas, 5 ml/min of $O_2$ gas, a process pressure of 0.2 Pa, microwave power of 800 W, time-modulated RF bias power of 600 W, and a duty ratio of 25% for the time-modulated RF bias power trenches having a depth of about 140 nm are formed.

At completion of the first trench formation step, trenches having a depth of about 140 nm are formed without occurrence of sideetching on that the sidewalls of the trenches as shown in FIG. 2D. However, a slight microloading takes place. It is considered that sideetching won't occur on the sidewalls of the trenches in the first trench formation step because the nitride film 203 formed on the sidewalls of the trenches by the first nitride film formation step acts as a protective film against sideetching. Since the first trench formation step is plasma etching performed while the time-modulated RF bias power is supplied, the selectivity of the etch rate for the trenches over the mask can be improved compared with the case where a continuous RF bias power is used.

Further, the nitride film 203 formed by the first nitride film formation step does not exist in the trenches having a depth of about 140 nm at this point. In other words, the first trench formation step is performed while the nitride film 203 on the sidewalls formed by the first nitride formation step is present.

Furthermore, although a mixture gas of $Cl_2$ gas and $O_2$ gas is used in the first trench formation step of the present embodiment, a mixture gas of HBr gas and $O_2$ gas may be used.

Next, a second nitride film formation step is performed to form a nitride film, which acts as a protective film against sideetching of the sidewalls of the trenches, on the sidewalls of the trenches about 140 nm deep formed in the first trench formation step.

The second nitride film formation step is carried out at the same conditions as the first nitride film formation step as shown in Table 1.

Figure 2E:
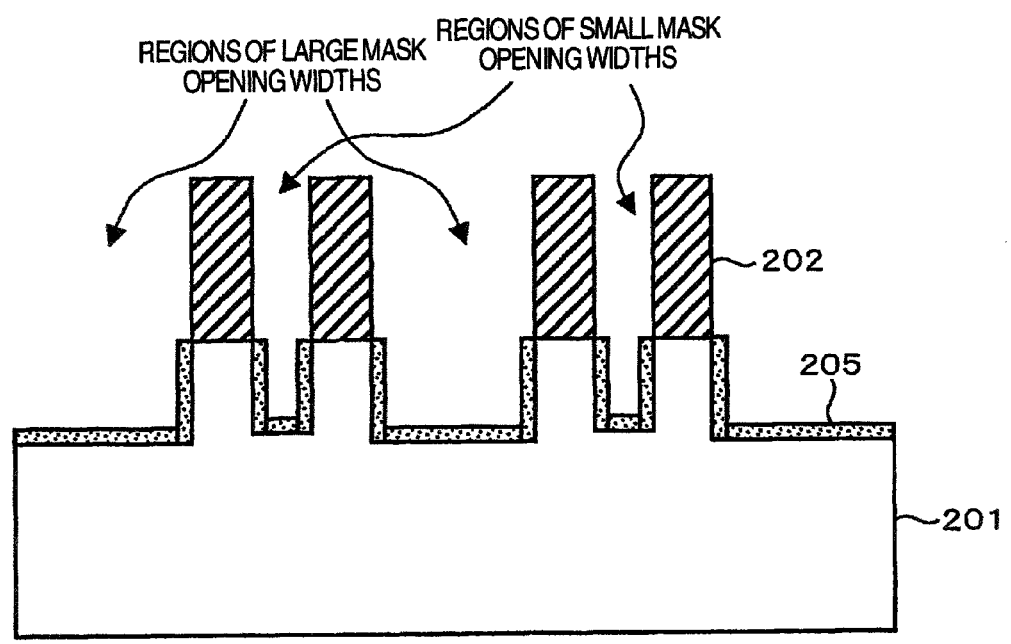
FIG. 2E is a diagram showing an etch profile after a second nitride film formation step.

At completion of the second nitride film formation step, a nitride film 205 is formed on the sidewalls and the bottom surfaces of the trenches about 140 nm deep formed in the first trench formation step as shown in FIG. 2E. Also, microloading produced by the first trench formation step is not mitigated.

Next, a second trench formation step is performed to form trenches about 220 nm deep by etching the trenches, on which the nitride film 205 is formed by the second nitride film formation step, by a depth equivalent to about 80 nm.

The second trench formation step is carried out at the same conditions as the first trench formation step as shown in Table 1.

Figure 2F:
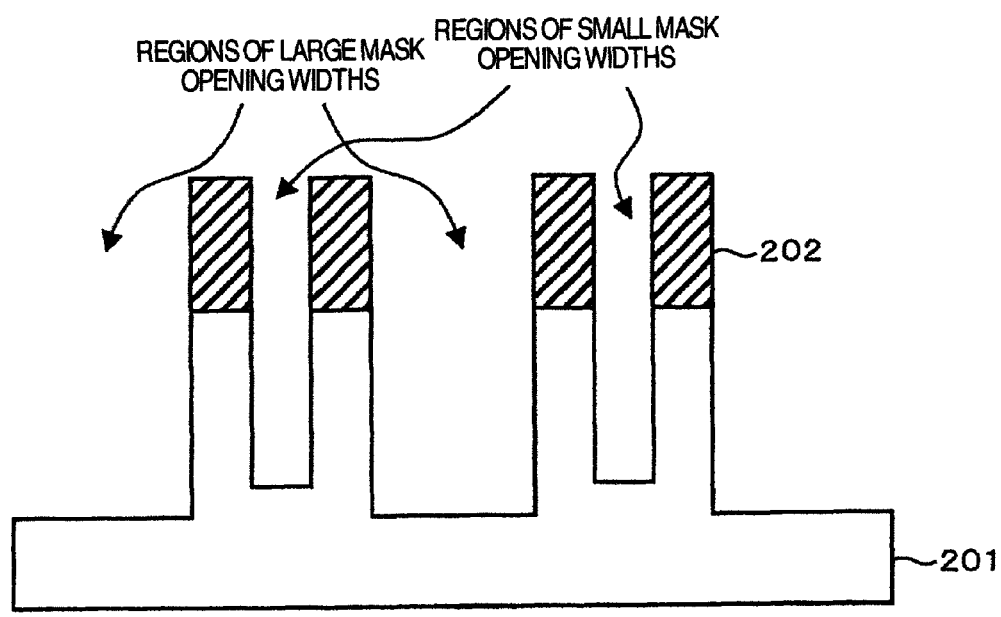
FIG. 2F is a diagram showing an etch profile after a second trench formation step.
Figure 3:
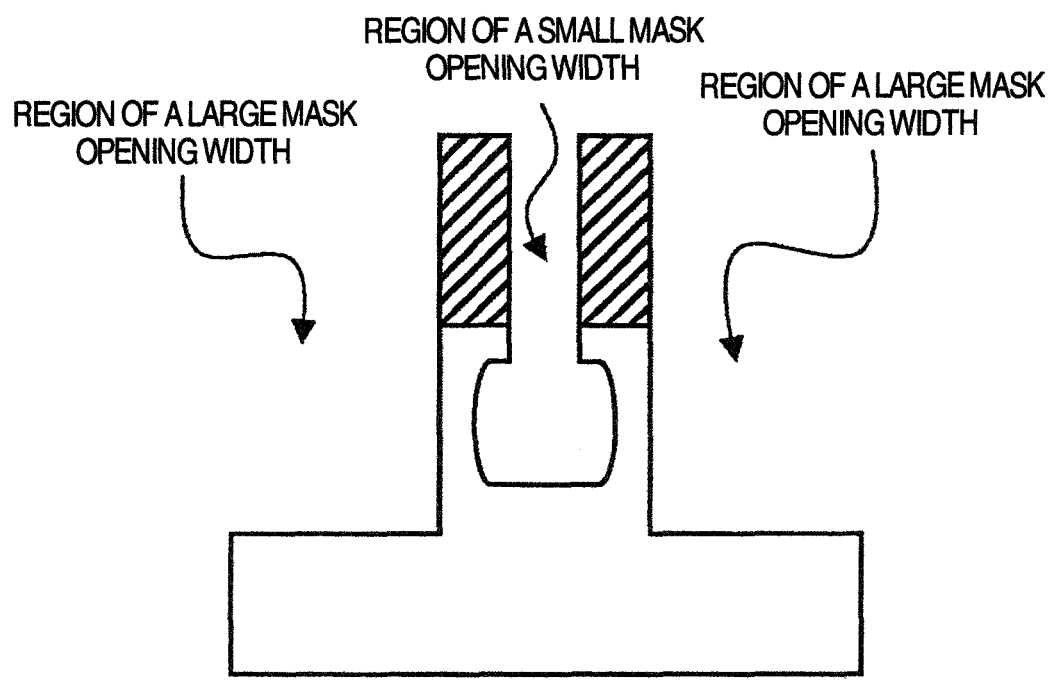
FIG. 3 is a diagram showing a trench formation in a prior art.

At completion of the second trench formation step, trenches about 220 nm deep are formed such that no sideetching occurs on the sidewalls of the trenches as shown in FIG. 2F. However, the microloading produced by the first trench formation step further progresses. The nitride film 205 formed by the second nitride film formation step is not present in the trenches about 220 nm deep at this point.

Next, an oxide film formation step is performed to form an oxide film 204, which acts as a protective film against sideetching of the sidewalls of the trenches, on the sidewalls of the trenches about 220 nm deep formed in the second trench formation step.

In the oxide film formation step with 30 ml/min of $O_2$ gas, a process pressure of 0.2 Pa, microwave power of 600 W, and RF bias power of 0 W as shown in Table 1, an oxide film 204 is formed.

At completion of the oxide film formation step, an oxide film 204 is formed on the sidewalls and the bottom surfaces of the trenches of about 220 nm depth formed in the second trench formation step as shown in FIG. 2G. Again, the microloading produced up to the second trench formation step remains unimproved.

Further, although only $O_2$ gas is used in the oxide film formation step of the present embodiment, a mixture gas of $O_2$ gas and Ar gas or a mixture gas of $O_2$ gas and He gas may be used.

Next, a third trench formation step is performed to form trenches about 300 nm deep by etching the trenches, on which the oxide film 204 is formed by the oxide film formation step, by a depth equivalent to about 80 nm.

The third trench formation step is carried out at the same conditions as the first trench formation step and the second trench formation step as shown in Table 1.

At completion of the third trench formation step, trenches about 300 nm deep are formed without occurrence of sideetching on the sidewalls of the trenches as shown in FIG. 2H. Furthermore, microloading is improved. Although a small amount of the oxide film 204 remains on the sidewalls of the trenches about 300 nm deep, however, it is removed by cleaning with hydrofluoric acid or the like performed after the third trench formation step.

The following is considered as a reason why the microloading can be improved in the third trench formation step.

The oxide film 204 formed on the sidewalls and the bottom surfaces of the trenches about 220 nm deep formed in the second trench formation step serves as a more secure protective film against chlorine radicals and chlorine ions than the nitride film 203 formed by the first nitride film formation step and the second nitride film formation step. Therefore, the oxide film 204 formed on the bottom surfaces of the trenches about 200 nm deep hinders etching by chlorine radicals and chlorine ions more than the nitride film 203 formed in the first nitride film formation step and the second nitride film formation step.

Since it is more difficult for the oxide film 204 to be formed on the bottom surfaces of the trenches in the regions of small mask opening widths with aspect ratios of 10 or higher than on the bottom surfaces of the trenches in the regions of large mask opening widths, the oxide film 204 formed on the bottom surfaces of the trenches in the regions of large mask opening widths is formed thicker than on the bottom surfaces of the trenches formed in the regions of small mask opening widths with aspect ratios of 10 or higher. Therefore, etching of the bottom surfaces of the trenches in the regions of large mask opening widths does not progress more than etching of the bottom surfaces of the trenches in the regions of small mask opening widths with aspect ratios of 10 or higher. It is considered that microloading is improved after the third trench formation step for this reason. Here, an aspect ratio is a value obtained by dividing the trench depth formed by plasma etching by the mask opening width. Incidentally, the trench depth formed by plasma etching does not include a mask thickness in the present specification.

By performing plasma processing of the embodiment of the present invention as described above, trenches can be formed while sideetching and microloading which occur in regions of small mask opening widths with a mask having an opening width of 20 nm or less.

TABLE 1

| step name | gas name (ml/min) | | | | process pressure (Pa) | microwave power (W) | RF bias power value (W) | RF bias duty ratio (%) |
| --- | --- | --- | --- | --- | --- | --- | --- | --- |
| | $Cl_2$ | $O_2$ | $CHF_3$ | $N_2$ | | | | |
| breakthrough | — | 60 | 60 | — | 2.0 | 700 | 800 | 10 |
| 1st nitride film formation | — | — | — | 100 | 2.0 | 600 | 0 | — |
| 1st trench formation | 100 | 5 | — | — | 0.2 | 800 | 600 | 25 |
| 2nd nitride film formation | — | — | — | 100 | 2.0 | 600 | 0 | — |
| 2nd trench formation | 100 | 5 | — | — | 0.2 | 800 | 600 | 25 |
| oxide film formation | — | 30 | — | — | 0.2 | 600 | 0 | — |
| 3rd trench formation | 100 | 5 | — | — | 0.2 | 800 | 600 | 25 |

As described above, the present invention is intended to form trenches while suppressing sideetching on the sidewalls of the trenches by nitride film formation steps and an oxide film formation step and to improve microloading by an oxide film formation step. Besides, in the present invention timing that the oxide film formation step is performed is important.

Figure 4A:
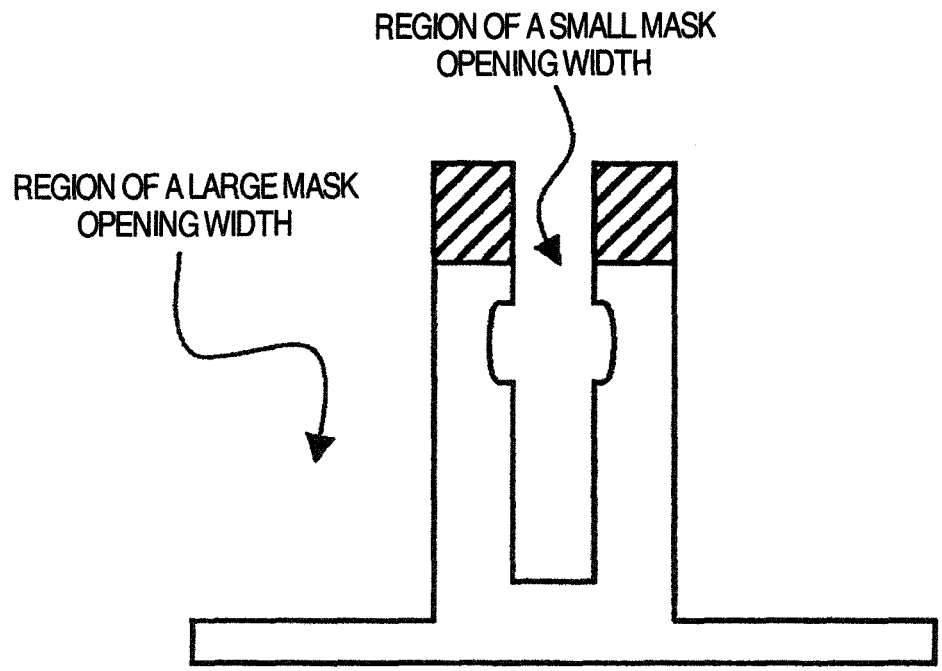
FIGS. 4A and 4B are diagrams showing profiles with different aspect ratios at the oxide film formation step.

For example, from forming trenches about 300 nm deep with a mask having an opening width of 20 nm or less in a sequence of the breakthrough step, the oxide film formation step, the first trench formation step, the first nitride film formation step, the second trench formation step, the second nitride film formation step, and the third trench formation step in this order, sideetching on the sidewalls of the trenches in the regions of small mask opening widths and large microloading result as shown in FIG. 4A. It should be noted that the plasma processing method of this case is the one with the oxide film formation step performed when the aspect ratio is 3.

Figure 4B:
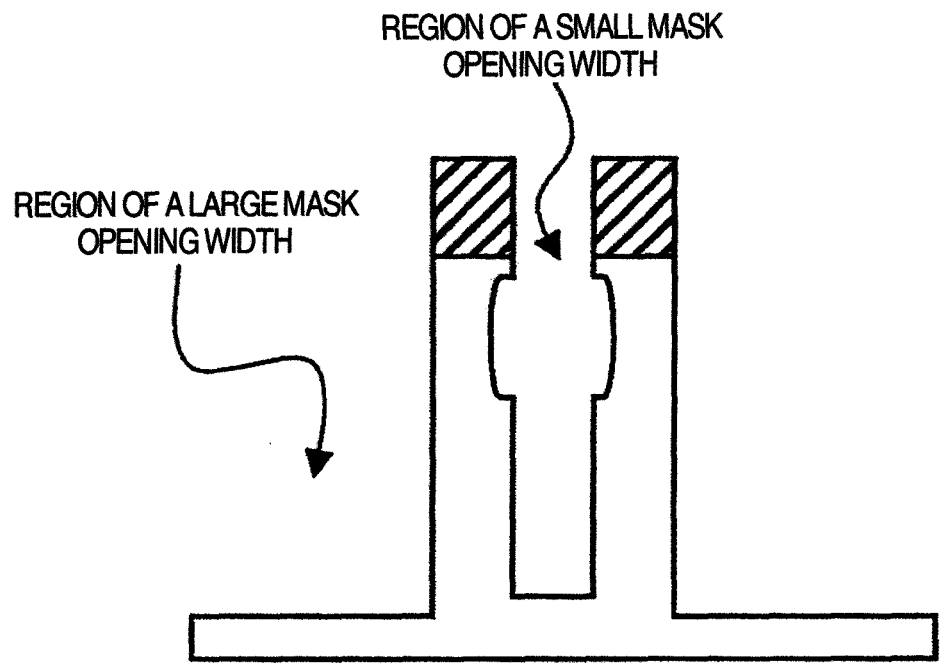

Next, by forming trenches about 300 nm deep with a mask having an opening width of 20 nm or less in a sequence of the breakthrough step, the first nitride film formation step, the first trench formation step, the oxide film formation step, the second trench formation step, the second nitride film formation step, and the third trench formation step in this order, sideetching on the sidewalls of the trenches in the regions of small mask opening widths occurs and microloading becomes smaller compared with the case where the oxide film formation step is performed at the aspect ratio of 3 as a result as shown in FIG. 4B. It should be noted that the plasma processing method of this case is the one with the oxide film formation step performed when the aspect ratio is 7.

In view of these results, trench depths, amounts of sideetching, and microloadings respective in a plasma processing method in which the oxide film formation step is performed when the aspect ratio is 3, in a plasma processing method in which the oxide film formation step is performed when the aspect ratio is 7, and in the plasma processing method of the embodiment of the present invention are shown in FIG. 5. It should be noted that the plasma processing method of the embodiment of the present invention is the one with the oxide film formation step performed when the aspect ratio is 11. Besides, it can be said that FIG. 5 is a graph showing the dependence on the aspect ratio at the oxide film formation step.

It can be seen from the results shown in FIG. 5 that the oxide film formation step must be performed when the aspect ratio is 10 or higher in order to suppress microloading to 13 nm or less while sideetching would not occur. Incidentally, in the present embodiment the tolerance value of microloading is set to 13 nm or less when trenches about 300 nm deep are formed with a mask having an opening width of 20 nm.

Also, in the present embodiment, one breakthrough step, two nitride film formation steps, three trench formation steps, and one oxide film formation step are carried out to form trenches approximately 300 nm deep; when trenches having depths greater than 300 nm are formed, the numbers of the nitride film formation steps and of the trench formation steps may be increased respectively to obtain a desired depth.

In addition, in the present embodiment, in order to form trenches about 300 nm deep, the nitride formation step and the trench formation step are performed twice of each until the oxide film formation step is performed; they may be performed more than twice of each.

That is, the plasma processing method of the present invention is characterized by that the nitride film formation step and the trench formation step are repeated until a given trench depth is achieved and the oxide film formation step is performed after the given trench depth is obtained.

Further, in the present embodiment, even though formation of trenches for device isolation is described, it is not limited thereto; it can also be applied to formation of deep trenches and to formation of trenches for capacitors.

Also, in the present embodiment, although an application example of in a microwave plasma etching apparatus of the ECR (electron cyclotron resonance) scheme using a microwave is described, it is not restricted thereto; it may also be applied to a plasma etching apparatus using plasma generation means of the capacitively or inductively coupled type.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method, for forming trenches by plasma-etching a silicon substrate with a mask having a minimum opening width of a trench pattern of 20 nm or less, comprising:
   a nitride-film forming step to form a nitride film;
   a first silicon-etching step to plasma-etch the silicon substrate using the mask, after the nitride-film forming step;
   an oxide-film forming step, to form an oxide film on bottom surfaces of the silicon substrate being plasma-etched to a given depth, using a plasma with RF power of 0 W supplied to a sample stage on which the silicon substrate is mounted, after the silicon substrate is plasma-etched to the given depth by repeating the nitride-film forming step and the first silicon-etching step; and
   a second silicon-etching step to plasma-etch the silicon substrate, after the oxide-film forming step.

2. The plasma processing method of claim 1, wherein the silicon substrate is subjected to microloading when being plasma-etched to the given depth, and the given depth corresponds to a depth which yields an aspect ratio of 10 or higher.

3. The plasma processing method of claim 2, wherein each of the nitride-film forming step and the oxide-film forming step uses a plasma, the plasma of the nitride-film forming step is a plasma using $N_2$ gas, and wherein the plasma of the oxide-film forming step is a plasma using $O_2$ gas.

4. The plasma processing method of claim 2, wherein plasma of the first silicon-etching step and plasma of the second silicon-etching step are plasmas using a mixture gas of $Cl_2$ gas and $O_2$ gas.

5. The plasma processing method of claim 1, wherein in the nitride-film forming step the nitride film is formed on exposed side surfaces and on bottom surfaces of the silicon substrate.

6. The plasma processing method of claim 1, wherein prior to the nitride-film forming step the silicon substrate is etched using the mask, so as to expose a bottom surface and side surfaces of the silicon substrate, and wherein in the nitride-film forming step the nitride film is formed on exposed side surfaces and on bottom surfaces of the silicon substrate.

7. The plasma processing method of claim 1, wherein in the oxide-film forming step the oxide film is formed on the bottom surfaces and exposed side surfaces of the silicon substrate.

8. A plasma processing method, for forming trenches by plasma-etching a silicon substrate with a mask having a minimum opening width of a trench pattern of 20 nm or less, comprising:
   a nitride-film forming step to form a nitride film;
   a first silicon-etching step to plasma-etch the silicon substrate using the mask;
   an oxide-film forming step, to form an oxide film on bottom surfaces of the silicon substrate being plasma-etched to a given depth, using a plasma with RF power of 0 W supplied to a sample stage on which the silicon substrate is mounted, after the silicon substrate is plasma-etched to the given depth by repeating the nitride-film forming step and the first silicon-etching step; and
   a second silicon-etching step to plasma-etch the silicon substrate, after the oxide-film forming step.

9. The plasma processing method of claim 8, wherein the silicon substrate is subjected to microloading when being plasma-etched to the given depth, and the given depth corresponds to a depth which yields an aspect ratio of 10 or higher.

10. The plasma processing method of claim 9, wherein each of the nitride-film forming step and the oxide-film forming step uses a plasma, the plasma of the nitride-film forming step is a plasma using $N_2$ gas, and wherein the plasma of the oxide-film forming step is a plasma using $O_2$ gas.

11. The plasma processing method of claim 9, wherein plasma of the first silicon-etching step and plasma of the second silicon-etching step are plasmas using a mixture gas of $Cl_2$ gas and $O_2$ gas.

12. The plasma processing method of claim 8, wherein in the nitride-film forming step the nitride film is formed on exposed side surfaces and on bottom surfaces of the silicon substrate.

13. The plasma processing method of claim 8, wherein prior to the nitride-film forming step the silicon substrate is etched using the mask, so as to expose a bottom surface and side surfaces of the silicon substrate, and wherein in the nitride-film forming step the nitride film is formed on exposed side surfaces and on bottom surfaces of the silicon substrate.

14. The plasma processing method of claim 8, wherein in the oxide-film forming step the oxide film is formed on the bottom surfaces and exposed side surfaces of the silicon substrate.

15. The plasma processing method of claim 1, wherein the mask is different from the nitride film formed in the nitride-film forming step.

16. The plasma processing method of claim 1, wherein the mask is different from the nitride film formed in the nitride-film forming step.

17. A plasma processing method, for forming trenches by plasma-etching a silicon substrate with a mask having a minimum opening width of a trench pattern of 20 nm or less, comprising:
   a nitride-film forming step to form a nitride film;
   a first silicon-etching step to plasma-etch the silicon substrate using the mask, after the nitride-film forming step;
   an oxide-film forming step to form an oxide film on bottom surfaces of the silicon substrate being plasma-etched to a given depth and being subjected to microloading, after the silicon substrate is plasma-etched to the given depth by repeating the nitride-film forming step and the first silicon-etching step; and
   a second silicon-etching step to plasma-etch the silicon substrate, after the oxide-film forming step.

18. The plasma processing method of claim 17, wherein the mask is different from the nitride film formed in the nitride-film forming step.

* * * * *